United States Patent [19]

Kleinschmidt et al.

[11] Patent Number: 4,677,337

[45] Date of Patent: Jun. 30, 1987

[54] BROADBAND PIEZOELECTRIC ULTRASONIC TRANSDUCER FOR RADIATING IN AIR

[75] Inventors: Peter Kleinschmidt; Valentin Magori, both of Munich, Fed. Rep. of Germany

[73] Assignee: Siemens Aktiengesellschaft, Berlin and Munich, Fed. Rep. of Germany

[21] Appl. No.: 926,801

[22] Filed: Oct. 29, 1986

Related U.S. Application Data

[63] Continuation of Ser. No. 709,715, Mar. 8, 1985, abandoned.

[30] Foreign Application Priority Data

Mar. 16, 1984 [DE] Fed. Rep. of Germany ....... 3409789

[51] Int. Cl.[4] ............................................. H01L 41/08

[52] U.S. Cl. .................................... 310/334; 310/326; 310/359; 310/366

[58] Field of Search ................................ 310/334–337, 310/326, 340, 365, 366, 357–359, 367, 368; 367/153, 155, 157, 162; 73/632, 641, 644

[56] References Cited

U.S. PATENT DOCUMENTS

| | | | |
|---|---|---|---|
| 2,408,028 | 9/1946 | Batchelder | 367/155 |
| 2,943,297 | 6/1960 | Steinberger et al. | 367/155 |
| 3,409,869 | 11/1968 | McCool et al. | 367/153 |
| 3,924,259 | 12/1975 | Butler et al. | 310/334 X |
| 4,122,725 | 10/1978 | Thompson | 310/326 |
| 4,233,477 | 11/1980 | Rice et al. | 310/334 X |
| 4,376,302 | 3/1983 | Miller | 310/366 X |
| 4,518,889 | 5/1985 | Hoen | 310/334 X |
| 4,550,606 | 11/1985 | Drost | 310/334 X |
| 4,572,981 | 2/1986 | Zola | 310/358 X |

*Primary Examiner*—Mark O. Budd

*Attorney, Agent, or Firm*—Hill, Van Santen, Steadman & Simpson

[57] ABSTRACT

A piezoelectric ultrasonic transducer for radiating ultrasonic energy in the medium of air has a number of piezoceramic ultrasonic radiators disposed in registry within a dimensionally stable carrier block which has an intrinsic acoustic impedance which is lower by a factor of at least eight than that of the piezoceramic material and which has a high mechanical attenuation $1/Q_m$ greater than approximately 0.05. The carrier block is yieldable at at least one closed face thereof for emission and/or reception of ultrasonic energy. The piezoelectric transducer elements may be divided into a number of side-by-side elements which may be individually energized, or may have electrodes connected in series for energizing the individual transducer elements in common. The combined operation of the ultrasonic transducer elements within the carrier block results in an ultrasonic transducer having broadband characteristics matched for ultrasonic transmission in the medium of air of short ultrasonic waveforms and for receiving ultrasonic energy for near-distance detection.

13 Claims, 4 Drawing Figures

BROADBAND PIEZOELECTRIC ULTRASONIC TRANSDUCER FOR RADIATING IN AIR

This is a continuation of application Ser. No. 709,715, filed Mar. 8, 1985, now abandoned.

BACKGROUND OF THE INVENTION

1. Field Of The Invention

The present invention relates to piezoelectric ultrasonic transducers, and in particular to such a transducer having broadband characteristics for transmission and/or reception of ultrasonic energy in the medium of air.

2. Description Of Prior Art

The use of piezoelectric transducers as ultrasonic transmission transducers and/or reception transducers in the medium of air is known in the art. Significant problems are associated with ultrasonic energy propagation in air because all materials useful for electro-mechanical energy conversion or mechanical-electrical energy conversion such as, for example, piezoceramic material, quartz, and the like have significantly different intrinsic acoustic impedances in comparison with air and thus the acoustic matching of that material to air is exceptionally poor. Attempts in the prior art to improve such matching have essentially followed one of two paths. Transducers having a particularly high mechanical Q are known which generate very large oscillation amplitudes, and are thus capable of transmitting sufficient energy into the medium of air. The other approach has been that of the so-called film transducer, for example, a capacitor microphone. A good matching of the intrinsic acoustic impedance of the transducer material to that of air is achieved because of the low mass of such film membranes, however, such transducers are extremely susceptible to mechanical damage so that the feasibility of the use of such transducers in an industrial environment is at best limited.

A further approach known in the art is that of utilizing a number of piezoceramic lamellae spaced from each other at distances which are considerably larger than the lamellae thickness, with the lamella being acoustically coupled at one end to a plate which serves as a radiating surface for ultrasonic energy, or as a reception plate for receiving ultrasonic energy. Such a structure is described in German OS No. 28 42 086. With suitable energization of the piezoceramic lamellae the plate of this transducer can be placed in in-phase oscillatory motion, so called piston stroke motion. The electrodes of the lamellae may be connected in parallel or in series as needed.

Whereas the transducer disclosed in OS No. 28 42 086 makes use of lamellae disposed substantially far apart with respect to the thicknesses of the individual lamellae, another approach is to dispose a plurality of individual transducer elements as closely together as possible, so as to mechanically acoustically couple the transducer elements. An example of this type of transducer arrangement is a crystal microphone described in Radio Mentor, Vol. 5 (1950) pages 236–238 or as described in German OS No. 30 40 563. The transducer lamellae are disposed as closely as possible side-by-side or above each other. Such transducer arrangements, particularly the crystal microphone described in Radio Mentor, result in a packet of crystal lamellae with a high cross-coupling, which has a negative affect on the desired piezoelectric efficiency. Moreover, because of the small spacing between the lamellae, only a small volume is available for an electrode or other means for energizing the lamellae, thereby limiting the power output of such devices.

SUMMARY OF THE INVENTION

It is an object of the present invention to provide a broadband ultrasonic transducer arrangement consisting of a plurality of adjacently disposed piezoelectric transducer elements which has a high-degree of mechanical ruggedness for use in industrial environments.

The above object is inventively achieved in a transducer arrangement consisting of a plurality of transducer elements, such as piezoelectric lamellae, disposed in registry and held within a dimensionally stable carrier block which is resilient or yieldable in at least one direction toward one face of the block, that fact serving to emit or receive acoustic energy. The carrier block is comprised of material having an intrinsic acoustic impedance ($Z_{ak}=\sqrt{E/\rho}$) which is lower by at least a factor of approximately 8 than the intrinsic acoustic impedance of the piezoceramic material comprising the lamellae. The carrier block also has a high internal mechanical attenuation $1/Q_m$ which is greater than approximately 0.5 (or alternatively stated, has a mechanical quality value $Q_m$ which is lower than approximately 20).

The structure disclosed herein makes use of the sandwich principal described in OS No. 24 82 086, however, in contrast to that known structure the subject matter of the present application can be more easily manufactured and, more importantly, does not require the affixing of a radiating or receiving plate the use of such a radiating or receiving plate adds another acoustical interface which must be matched, and additionally requires some means of attaching the plate to the transducer. In the transducer disclosed in the present application, the spaces between the lamellae are considerable with respect to the thickness of the lamellae and are filled with piezoelectrically inactive material which guarantees dimensional stability. The filling of these spaces results in a sandwich or layer structure, wherein the films or lamellae of filler material are alternated and are rigidly connected to each other to form a unitary transducer arrangement. The union is so firm that even subsequent shaping processing can be undertaken on the unit, such as, for example, smoothing a selected face of the unit by grinding or some other type of material removal. The smoothed surface of the unit may then serve as the radiating or receiving face of the transducer unit.

Materials suitable for use as the carrier block is, for example, foamed polyurethane, silicone rubber, polyethylene, expanded polystyrene and the like. Several further factors must be considered in selecting a suitable material for the carrier block. Polyethylene, for example, in film or lamina form, is particularly suitable due to the thermoplastic property of polyethylene. Such a sandwich structure can be solidified into a single member in a simple manner by heating and, under given conditions, by the application of light pressure. The radiation/receiving fact may be prepared after cooling. Because the piezoceramic lamella are relatively thin in comparison to the intervening polyethylene films or lamina, a moisture-proof enclosure surrounding the lamellae on all sides is obtained, with the piezoceramic lamellae being imbedded in the polyethylene.

Silicon rubber is beneficial from a different point of view, because the piezoceramic lamellae can be directly cast into a block of such material.

Expanded polyurethane or polystyrene can be connected to the piezoceramic lamellae in layers by means of glueing. Such expanded materials are particularly useful in an industrial environment because the material has a high dimensional stability while exhibiting a low mass promoting a particularly low intrinsic acoustic impedance. Expanded polyurethane or polystyrene can also be easily processed to generate the radiating-/receiving face.

If the material filling the spaces between the transducer elements is in lamina form, each lamina may be provided with recesses on adjacent faces thereof for receiving a transducer element between those faces when the faces are joined.

An additional layer or coating may be provided on the radiating/receiving face of the unitary transducer member, this additional layer consisting of comparatively harder material than the material comprising the carrier block so as to provide greater flexural strength for the unit. If such an additional layer is utilized, a cross-coupling at the reception or radiating face of the member can be achieved which is higher than cross-coupling without the layer.

DESCRIPTION OF THE PREFERRED EMBODIMENTS

Figure 1:
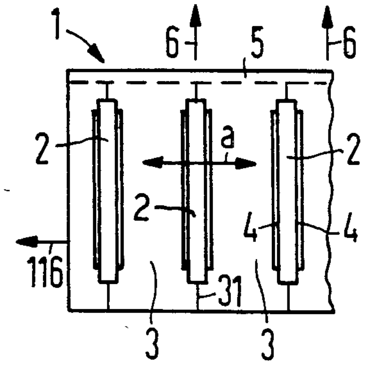
FIG. 1 is a side elevational view of a transducer arrangement constructed in accordance with the principles of the present invention.
Figure 2:
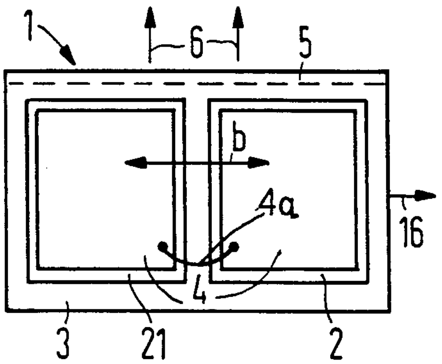
FIG. 2 is a front elevational view of a transducer arrangement constructed in accordance with the principles of the present invention.

A transducer arrangement 1 constructed in accordance with the principles of the present invention is shown in side and front elevational views in FIGS. 1 and 2. Three piezoceramic lamellae 2 are shown in FIG. 1 disposed adjacent each other registry. Each lamellae 2 has electrodes 4 on opposite sides thereof, the electrically connections to the electrodes 4 being omitted for clarity. In a preferred embodiment, the lamellae 2 are spaced from each other by a distance which is at least four times the thickness of the lamellae 2. The lamellae 2 preferably have a thickness in the range of approximately 0.08 through approximately 0.3 mm, and are spaced from each other by a distance in the range of approximately 0.5 through approximately 2.5 mm. The lamellae are surrounded by a carrier block 3 consisting of dimensionally stable material, for example polyethylene, which completely fills the spaces between the lamellae 2. In the embodiment shown in FIG. 1, the lines 31 represent boundaries of individual carrier block laminae, which were combined in sandwich fashion with the lamellae 2 and which have been thermoplastically bonded to each other by the application of heat. An adhesive seam is present along the lines 31 in the finished transducer arrangement 1. If, however, the carrier block is comprised of material which can be cast, for example silicon rubber, the lamellae 2 will be imbedded in the material 3 on all sides and no seams will be present.

Figure 3:
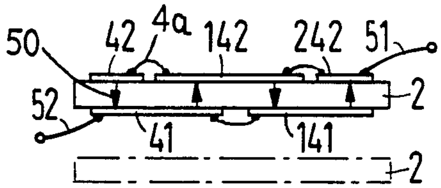
FIG. 3 is a plane view of a further embodiment of a transducer arrangement constructed in accordance with the principles of the present invention.

The elevational view shown in FIG. 2 shows two side-by-side transducer elements 2 and 21. It is also possible for the lamellae 2 comprising the transducer elements to be continuous, as shown in FIG. 3 discussed below. Depending upon the particular employment of the transducer arrangement, the embodiment utilizing side-by-side transducers 2 and 21 may be advantageous. The subdivision shown in FIG. 2 achieves a significantly lower cross-coupling for the overall transducer arrangement 1 in the direction of arrow b shown in FIG. 2 in comparison to the embodiment wherein a single lamellae 2 is utilized. Such division also results in a reduced cross-coupling in the direction a shown in FIG. 1. As shown in FIG. 2, the electrodes 4 for the elements 2 and 21 may be coupled by a connection 4*a*, or the transducers may be individually energized.

As also shown in FIGS. 1 and 2, the transducer arrangement 1 may be provided with an additional layer 5, which may offer particular advantages if the carrier block 3 is comprised of expanded material. The use of the layer 5 with such material provides a more dense surface. Again if the carrier block 3 consists of expanded material, the additional layer 5 may be realized as an integral component thereof by simply compressing the expanded material along one face of the carrier block 3. The layer 5, whether in the form of additional coating or surface compression, may be necessary to achieve increase in the mechanical resistance of the face of the transducer arrangement 1 which is to be utilized as the radiating and/or reception surface during operation. The arrows 6 shown in FIGS. 1 and 2 indicate acoustic energy transmission from this face. As shown in FIG. 1, acoustic transmission may also be achieved from the front and rear faces, as indicated by the arrow 116, or from the side faces as indicated by the arrow 16. If acoustic energy radiation or reception is desired in the direction of arrow 16, it is preferable to use one-piece lamellae 2, rather than the subdivision shown in FIG. 2.

A unitary lamellae 2 is shown in plane view in FIG. 3 with a different electrode configuration. In this embodiment, the electrode on one side of the lamellae 2 is divided into electrodes 41 and 141 and the electrode on the opposite side is divided into three electrodes 42, 142 and 242. The electrode coatings 41, 42, 141, 142 and 242 are preferably strip-shaped in a direction perpendicular to the plane of the view drawing in FIG. 3. The split-electrode embodiment shown in FIG. 3 increases the electrically matching resistance and achieves a higher electrical voltage in the receive mode. The alternating arrows 50 indicate the relative polarization in the lamellae 2 achieved by this electrode arrangement. The electrodes on the respective faces of the lamellae 2 are connected in series by connection 4*a*, and are provided with respective electrical leads 51 and 52.

Figure 4:
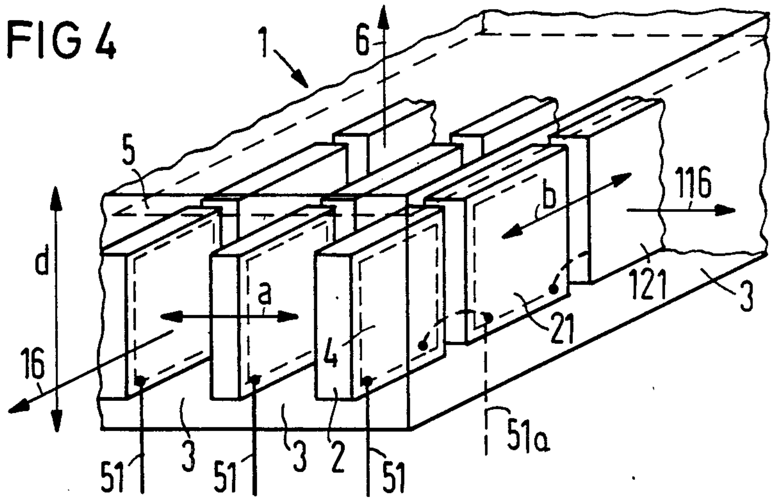
FIG. 4 is a perspective view of another embodiment of a transducer arrangement constructed in accordance with the principles of the present invention.

A portion of a much larger block of carrier material 3 is shown in FIG. 4. Although a plurality of side-by-side lamellae 2, 21 and 121 are shown, it will be understood this embodiment may employ one-piece lamellae instead. The arrows a and b orient the embodiment shown in FIG. 4 comparable to the orientations shown in FIGS. 1 and 2, with the additional axis d being shown indicating the vertical dimension. As also shown in FIG. 4, it may be desirable to energize the transducer arrangement 1 in different manners for the transmit mode and the receive mode. For example, it can be beneficial to electrically connect all transducer elements in parallel for the transmit mode in order to achieve a relatively low excitation voltage, and to connect at least certain of the transducers in series for the receive mode in order to achieve a high electrical reception voltage. This is indicated in FIG. 4 by the dashed line connections between individual transducers 2, 21 and 121, and the alternative external lead 51*a*.

If material such as polyethylene is utilized as the carrier block 3, the carrier block 3 may be substantially optically transparent.

Although modifications and changes may be suggested by those skilled in the art it is the intention of the inventor to embody within the patent warranted hereon all changes and modifications as reasonably and properly come within the scope of his contribution to the art.

We claim as our invention:

1. A broadband ultrasonic transducer arrangement for radiating and/or receiving ultrasonic energy in the medium of air comprising a plurality of piezoelectric transducer elements disposed in registry in a like plurality of substantially parallel planes and respective layers of acoustically inactive material disposed between said transducer elements and maintaining a spacing between transducer elements in adjacent planes which is substantially larger than a thickness of said transducer elements, said acoustically inactive material being dimensionally stable and having an intrinsic acoustic impedance which is lower by a factor of at least approximately eight than the intrinsic acoustic impedance of said transducer elements and having a mechanical attenuation greater than approximately 0.05, said acoustically inactive material forming at least one closed face of said transducer arrangement for emission and/or reception of ultrasonic energy.

2. A transducer arrangement as claimed in claim 1 wherein said acoustically inactive material extends over at least one edge of each of said transducer elements for covering said transducer element edges to the outside environment.

3. A transducer arrangement as claimed in claim 1 further comprising an additional layer disposed on said surface of said transducer arrangement for emission and/or reception of ultrasonic energy.

4. A transducer arrangement as claimed in claim 3 wherein said acoustically inactive material is compressable material, and wherein said layer is a compressed layer of said material.

5. A transducer arrangement as claimed in claim 3 wherein said additional layer is comprised of material which is comparatively harder than said acoustically inactive material.

6. A transducer arrangement as claimed in claim 1 wherein said acoustically inactive material is in the form of adjacent laminae having recesses on opposite sides thereof for receiving said transducer elements.

7. A transducer arrangement as claimed in claim 1 wherein each transducer element is subdivided into a plurality of side-by-side sub-elements in a common plane.

8. A transducer arrangement as claimed in claim 1 wherein each of said transducer elements is provided with electrodes on opposite sides thereof, and wherein said electrodes are split into at least two separate electrodes.

9. A transducer arrangement as claimed in claim 1 wherein said transducer elements are piezoceramic lamellae.

10. A transducer arrangement as claimed in claim 6, wherein said acoustically inactive laminae consist of thermoplastic material, said laminae being joined by thermoplastic bonding.

11. A transducer arrangement as claimed in claim 10, wherein said thermoplastic material is expanded polystyrene.

12. A transducer arrangement as claimed in claim 10, wherein said thermoplastic material is polyethylene.

13. A transducer arrangement as claimed in claim 1, wherein said acoustically inactive material surrounds all of said transducer elements on all sides thereof.

* * * * *